(12) United States Patent
Rotenberg et al.

(10) Patent No.: US 6,944,047 B2
(45) Date of Patent: Sep. 13, 2005

(54) VARIABLE-PERSISTENCE MOLECULAR MEMORY DEVICES AND METHODS OF OPERATION THEREOF

(75) Inventors: Eric Rotenberg, Apex, NC (US); Jonathan S. Lindsey, Raleigh, NC (US)

(73) Assignee: North Carolina State University, Raleigh, NC (US)

( * ) Notice: Subject to any disclaimer, the term of this patent is extended or adjusted under 35 U.S.C. 154(b) by 327 days.

(21) Appl. No.: 10/324,868

(22) Filed: Dec. 19, 2002

(65) Prior Publication Data

US 2004/0120180 A1 Jun. 24, 2004

(51) Int. Cl.[7] .............................................. G11C 11/00
(52) U.S. Cl. ........................................ 365/151; 365/153
(58) Field of Search ................................ 365/151, 152, 365/153, 106

(56) References Cited

U.S. PATENT DOCUMENTS

| | | | |
|---|---|---|---|
| 6,208,553 B1 | 3/2001 | Gryko et al. | 365/151 |
| 6,212,093 B1 | 4/2001 | Lindsey | 365/151 |
| 6,272,038 B1 | 8/2001 | Clausen et al. | 365/151 |
| 6,324,091 B1 | 11/2001 | Gryko et al. | 365/151 |
| 6,381,169 B1 | 4/2002 | Bocian et al. | 365/151 |
| 6,407,330 B1 | 6/2002 | Lindsey et al. | 136/263 |
| 6,420,648 B1 | 7/2002 | Lindsey | 136/263 |
| 6,451,942 B1 | 9/2002 | Li et al. | 526/258 |
| 6,657,884 B2 * | 12/2003 | Bocian et al. | 365/151 |
| 6,728,129 B2 * | 4/2004 | Lindsey et al. | 365/151 |
| 6,777,516 B2 * | 8/2004 | Li et al. | 526/258 |
| 6,809,955 B2 * | 10/2004 | Bulovic et al. | 365/151 |
| 2002/0180446 A1 | 12/2002 | Kuhr et al. | 324/432 |

OTHER PUBLICATIONS

U.S. Appl. No. 10/193,827, filed Jul. 12, 2002, entitled "Substrates Carrying Polymers of Linked Sandwich Coordination Compounds and Methods of Use There,".

U.S. Appl. No. 09/670,463, filed Sep. 26, 2000, entitled "Trans Beta Substituted Chlorins and Methods of Making and Using the Same,".

U.S. Appl. No. 09/852,560, filed May 10, 2001, entitled "Trans Beta Substituted Chlorins and Methods of Making and Using the Same,".

U.S. Appl. No. 10/011,121, filed Dec. 7, 2001, entitled "Regioisomerically Pure Oxochlorins and Methods of Synthesis,".

U.S. Appl. No. 10/141,654, filed May 8, 2002, entitled "Solar Cells Incorporating Light Harvesting Arrays,".

(Continued)

*Primary Examiner*—Gene N. Auduong
(74) *Attorney, Agent, or Firm*—Myers Bigel Sibley & Sajovec PA

(57) ABSTRACT

A molecular memory cell includes first and second electrodes. First and second charge storage molecules have respective first and second oxidation potentials and are disposed between the first and second electrodes. A molecular linkage couples the first and second charge storage molecules to the first electrode and provides respective first and second electron transfer rates for the first and second charge storage molecules. The first and second different oxidation potentials are different and/or the first and second electron transfer rates are different. In particular, the second oxidation potential may be greater than the first oxidation potential and the first electron transfer rate may be greater than the second electron transfer rate, such that the first charge storage molecule may be used as fast, volatile primary memory and the second charge storage molecule can be used as slower, less volatile secondary memory. In various embodiments, memory cells can be constructed from an admixture of charge storage molecules or by using a bipartite charge storage molecule. Memory cells can include a molecular transistor incorporating such molecular structures.

64 Claims, 7 Drawing Sheets

OTHER PUBLICATIONS

U.S. Appl. No. 10/135,220, filed Apr. 29, 2002, entitled "Rational Syntheses of Heteroleptic Lanthanide Sandwich Coordination Complexes,".

U.S. Appl. No. 10/140,654, filed May 8, 2002, entitled "Refined Routes to Chlorin Building Blocks,".

U.S. Appl. No. 09/932,196, filed Aug. 24, 2001, entitled "Convergent Synthesis of Multiporphyrin Light–Harvesting Rods,".

U.S. Appl. No. 09/962,742, filed Sep. 25, 2001, entitled "Methods of Making Porphyrins and Related Compounds with Lewis Acids,".

U.S. Appl. No. 10/164,474, filed Jun. 6, 2002, entitled "Soluble Perylene–Porphyrin Building Blocks for Use in Light–Harvesting Rods,".

Gryko et al., "Thiol–Derivatized Porphyrins for Attachment to Electroactive Surfaces," *J. Org. Chem.*, 1999, 64, pp. 8635–8647.

Gryko et al., "Synthesis of "Porphyrin–Linker–Thiol" Molecules with Diverse Linkers for Studies of Molecular–Based Information Storage," *J. Org. Chem.*, 2000, 65, pp. 7345–7355.

Gryko et al., "Synthesis of Thiol–Derivatized Ferrocene–Porphyrins for Studies of Multibit Information Storage," *J. Org. Chem.*, 2000, 65, pp. 7356–7362.

Clausen et al., "Synthesis of Thiol–Derivatized Porphyrin Dimers and Trimers for Studies of Architectural Effects on Multibit Information Storage," *J. Org. Chem.*, 2000, 65, pp. 7363–7370.

Clausen et al., "Investigation of Tightly Coupled Porphyrin Arrays Comprised of Identical Monomers for Multibit Information Storage," *J. Org. Chem.*, 2000, 65, pp. 7371–7378.

Li et al., "Synthesis of Thiol–Derivatized Europium Porphyrinic Triple–Decker Sandwich Complexes for Multibit Molecular Information Storage," *J. Org. Chem.*, 2000, 65, pp. 7379–7390.

Zimmerman et al., "Molecular Rods: Synthesis and Properties," *J. Org. Chem.*, 1992, 57, pp. 5484–5492.

Rao et al., "Rational Syntheses of Porphyrins Bearing up to Four Different Meso Substituents," *J. Org. Chem.*, 2000, 65, pp. 7323–7344.

Gryko et al., "Studies related to the design and synthesis of a molecular octal counter," *J. Mater. Chem.*, 2001, 11, pp. 1162–1180.

Gross et al., "Investigation of Rational Syntheses of Heteroleptic Porphyrinic Lanthanide (Europium, Cerium) Triple–Decker Sandwich Complexes," *Inorg. Chem.*, 2001, 40, pp. 4762–4774.

Schweikart et al., "Design, synthesis, and characterization of prototypical multistate counters in three distinct architectures," *J. Mater. Chem.*, 2002, 12, pp. 808–828.

* cited by examiner

*primary storage molecule*

*secondary storage molecule*

*primary storage molecule*

*secondary storage molecule*

VARIABLE-PERSISTENCE MOLECULAR MEMORY DEVICES AND METHODS OF OPERATION THEREOF

STATEMENT OF FEDERAL SUPPORT

This invention was made with Government support under grant number ONR (N00014-99-1-0357) from the Office of Naval Research. The Government has certain rights to this invention.

BACKGROUND OF THE INVENTION

The present invention relates to memory devices, and more particularly, to molecular memory devices.

Traditionally, semiconductor materials, such as silicon, have been used to implement memory circuits. Typically, the semiconductor materials are used in combination with dielectric and conductive materials to fashion transistors, capacitors, resistors, inductors and other basic circuit elements, which are arranged in various combinations to form memory cells and other components of memory devices.

Other types of materials are currently being investigated to replace semiconductor materials in memory devices and other electronics applications, due to the ongoing need to produce electronic devices with greater information storage density, lower cost, higher speed, and other desirable characteristics. Such new materials include organic molecular materials that can store information by taking on various oxidation states in response to applied signals. Such materials offer potentially higher component density, response speeds, and energy efficiency in memory applications.

A variety of approaches have been proposed for molecular memory devices. For example, a hybrid molecular-silicon transistor for use in memory devices and other applications has been proposed. Applying a negative potential between the gate and drain of the molecular transistor charges a layer of redox-active molecules; applying a higher potential discharges the same molecular layer. Because the molecules have two possible states, charged or discharged, this device can be used as a 1-bit memory cell. A logical 1 is written by charging the redox-active molecules, also called programming. A logical 0 is written by discharging the redox-active molecules, also called erasing. A logical 0 or 1 is read by sensing a drain-to-source current, which is modulated by the charged state of the redox-active molecules. Programming and erasing typically involves transfer of electrons to and from the molecules, typically by electron tunneling.

Conventional electronic devices, such as personal computers (PCs), laptop computers, personal digital assistants (PDAs), wireless terminals, digital cameras, and the like, often employ a two-tier data storage strategy to enable the device to store and retrieve data quickly and efficiently while in a normal, powered operational mode, and to retain valued data when the device transitions to an unpowered state or a low-powered quiescent or "sleep" state. In particular, typical electronic devices may include volatile storage, such as static random access memory (SRAM) and/or dynamic random access memory (DRAM), as well as non-volatile storage, such as a magnetic disk, non-volatile random access memory (NVRAM) and/or flash memory. An exemplary implementation of such a strategy is illustrated in FIG. 1, which shows volatile SRAM/DRAM backed by non-volatile magnetic disk storage.

Although such a strategy can be effective, and is used in a wide variety of conventional devices, it can entail a certain amount of overhead. For example, a typical personal computer loads its operating system from non-volatile storage, typically a flash memory and/or disk, upon powering up the computer. Loading the operating system may take a long time and may consume significant power. After operating system loading, significant time may elapse and significant power may be consumed while the operating system re-initializes the overall system. In addition, a user may need to restart applications where he/she left off the last time the computer was in use, which often involves loading the applications from the non-volatile storage, typically the disk drive, into faster, volatile storage, typically DRAM. Turning off the computer typically requires a comparable software shutdown sequence, so that data integrity can be maintained.

SUMMARY OF THE INVENTION

According to some embodiments of the present invention, a molecular memory cell includes first and second electrodes. First and second charge storage molecules have respective first and second oxidation potentials and are disposed between the first and second electrodes. A molecular linkage couples the first and second charge storage molecules to the first electrode and provides respective first and second electron transfer rates for the first and second charge storage molecules, wherein the first and second different oxidation potentials are different and/or the first and second electron transfer rates are different. In particular, in some embodiments, the second oxidation potential may be greater than the first oxidation potential and the first electron transfer rate may be greater than the second electron transfer rate, such that the first charge storage molecule may be used as fast, volatile primary memory and the second charge storage molecule can be used as slower, less volatile secondary memory.

In further embodiments of the present invention, a molecular memory cell includes first and second electrodes and an admixture of charge storage molecules disposed between the first and second electrodes. The admixture includes a first charge storage molecule including a first charge storage unit with a first oxidation potential and a first linker that couples the first charge storage unit to the first electrode and provides a first electron transfer rate. The admixture further includes a second charge storage molecule including a second charge storage unit with a second oxidation potential and a second linker that couples the second charge storage unit to the first electrode and provides a second electron transfer rate. The first and second oxidation potentials are different and/or the first and second electron transfer rates are different. In particular, the second oxidation potential may be greater than the first oxidation potential, and the first electron transfer rate may be greater than the second electron transfer rate, to provide multiple levels of programming speed and/or data retention. In some embodiments, the first and second electrodes are coupled to first and second conductors of a conductor array, e.g., in a crossbar structure. In other embodiments, the molecular memory cell includes an access transistor coupled to one of the first and second electrodes, similar to a conventional DRAM structure. In further embodiments, such a molecular memory cell may include a molecular transistor including the first electrode, the first charge storage molecule, the second charge storage molecule, and the second electrode. An electrolyte may be disposed between the first and second storage molecules and the gate electrode.

The first and second charge storage units may be selected from a group consisting of porphyrinic macrocycles, metallocenes (including ferrocenes), linear polyenes, cyclic polyenes, tetrathiafulvalenes, tetraselenafulvalenes, metal coordination complexes, sandwich coordination compounds, triarylamines, 1,4-phenylenediamines, xanthenes, flavins, phenazines, phenothiazines, acridines, quinolines, 2,2'-bipyridyls, 4,4'-bipyridyls, tetrathiotetracenes, and peri-bridged naphthalene dichalcogenides. The first and second linkers may be selected from a group consisting of 4-carboxyphenyl, 2-(4-carboxyphenyl) ethynyl, 4-(2-(4-carboxyphenyl)ethynyl)phenyl, 4-carboxymethylphenyl, 4-(2-(4-carboxymethylphenyl) ethynyl)phenyl; 4-hydroxyphenyl, 2-(4-hydroxyphenyl) ethynyl, 4-(2-(4-hydroxyphenyl)ethynyl)phenyl, 4-hydroxymethylphenyl, 4-(2-(4-hydroxymethylphenyl) ethynyl)phenyl; 4-mercaptophenyl, 2-(4-mercaptophenyl) ethynyl, 4-(2-(4-mercaptophenyl)ethynyl)phenyl, 4-mercaptomethylphenyl, 4-(2-(4-mercaptomethylphenyl) ethynyl)phenyl; 4-selenylphenyl, 2-(4-selenylphenyl) ethynyl, 4-(2-(4-selenylphenyl)ethynyl)phenyl, 4-selenylmethylphenyl, 4-(2-(4-selenylphenyl)ethynyl) phenyl; 4-tellurylphenyl, 2-(4-tellurylphenyl)ethynyl, 4-(2- (4-tellurylphenyl)ethynyl)phenyl, 4-tellurylmethylphenyl, 4-(2-(4-tellurylmethylphenyl)ethynyl)phenyl; 4-vinylphenyl, 4-allylphenyl, 2-(4-vinylphenyl)ethynyl, 4-(2-(4-vinylphenyl)ethynyl)phenyl, 4-allylphenyl, 4-(2-(4-allylphenyl)ethynyl)phenyl, 4-(dihydroxyphosphoryl) phenyl, 2-[4-(dihydroxyphosphoryl)phenyl]ethynyl, 4-[2- [4-(dihydroxyphosphoryl)phenyl]ethynyl]phenyl, 4-[(dihydroxyphosphoryl)methyl]phenyl, 4-[2-(dihydroxyphosphoryl)ethyl]phenyl, 4-[2-[4-(dihydroxyphosphoryl)methylphenyl]ethynyl]phenyl; 4-(hydroxy(mercapto)phosphoryl)phenyl, 2-[4-(hydroxy (mercapto)phosphoryl)phenyl]ethynyl, 4-[2-[4-(hydroxy (mercapto)phosphoryl)phenyl]ethynyl]phenyl, 4-[(hydroxy (mercapto)phosphoryl)methyl]phenyl, 4-[2-(hydroxy (mercapto)phosphoryl)ethyl]phenyl, 4-[2-[4-(hydroxy (mercapto)phosphoryl)methylphenyl]ethynyl]phenyl; 4-cyanophenyl, 2-(4-cyanophenyl)ethynyl, 4-[2-(4-cyanophenyl)ethynyl]phenyl, 4-(cyanomethyl)phenyl, 4-(2-cyanoethyl)phenyl, 4-[2-[4-(cyanomethyl)phenyl]ethynyl] phenyl, 4-cyanobiphenyl, 4-aminophenyl, 2-(4-aminophenyl)ethynyl, 4-[2-(4-aminophenyl)ethynyl] phenyl, and 4-aminobiphenyl.

In some exemplary embodiments, the first charge storage unit includes a first metalloporphyrin unit, and the first linker includes a p-phenylene unit including a first surface attachment moiety configured to electrically couple the first linker to the first electrode and to provide a first electron transfer rate. The second charge storage unit includes a second metalloporphyrin unit having an oxidation potential that is shifted with respect to the first metalloporphyrin unit. The second linker includes a butyl chain, a plurality of bicyclooctane units, a p-phenylene unit, and a second surface attachment moiety configured to couple the second linker to the first electrode and to provide a second electron transfer rate less than the first electron transfer rate.

In further exemplary embodiments, the first charge storage unit includes a first metallocene unit, and the first linker includes a first p-phenylene unit including a surface attachment moiety configured to electrically couple the first linker to the first electrode and to provide a first electron transfer rate. The second charge storage unit includes a second metallocene unit having an oxidation potential that is shifted with respect to the first metallocene molecule. The second linker includes a second p-phenylene unit including a surface attachment moiety configured to couple the second linker to the first electrode and to provide a second electron transfer rate less than the first electron transfer rate. The first and second metallocene units may bear respective different sets of electron-withdrawing and/or electron-releasing peripheral substituent groups to provide desired oxidation potentials.

In additional embodiments of the present invention, a molecular memory cell includes first and second electrodes. A first charge storage unit is disposed between the first and second electrodes and has a first oxidation potential, and is coupled to the first electrode by a first linker that provides a first electron transfer rate. A second charge storage unit is disposed between the first and second electrodes and has a second oxidation potential. A second linker couples the second charge storage unit to the first charge storage unit and provides a second electron transfer rate. The first and second oxidation potentials are different and/or the first and second electron transfer rates are different. In particular, the second oxidation potential may be greater than the first oxidation potential, and the first electron transfer rate may be greater than the second electron transfer rate, to provide multiple levels of programming speed and/or data retention. In some embodiments, the first and second electrodes are coupled to first and second conductors of a conductor array, e.g., in a crossbar structure. In other embodiments, the molecular memory cell includes an access transistor coupled to one of the first and second electrodes, similar to a conventional DRAM structure. In further embodiments, the memory cell includes a molecular transistor including the first electrode, the first charge storage unit, the first linker, the second charge storage unit, the second linker, and the second electrode, wherein the second electrode is coupled to a gate electrode of the molecular transistor and wherein the first electrode is coupled to a channel region of the molecular transistor.

In exemplary embodiments, the first charge storage unit includes a first metalloporphyrin, and the first linker includes a p-phenylene unit including a surface attachment moiety configured to electrically couple the first linker to the first electrode. The second charge storage unit includes a second metalloporphyrin having an oxidation potential that is shifted with respect to the first metalloporphyrin, and the second linker includes a butyl chain, a plurality of bicyclooctane units, and a p-phenylene unit configured to couple the second linker to the first charge storage unit.

In still further embodiments of the present invention, a molecular transistor includes a substrate, spaced-apart first and second source/drain regions in the substrate, and a gate electrode disposed between the first and second source/drain regions. First and second charge storage molecules having respective first and second oxidation potentials are disposed between the gate electrode and a portion of the substrate between the first and second source/drain regions and are coupled to the substrate by a molecular linkage that provides respective first and second electron transfer rates for the first and second charge storage molecules. The first and second oxidation potentials are different and/or the first and second electron transfer rates are different.

The present invention offers many potential benefits. In particular, the use of a molecular memory cell with multiple levels of speed and persistence in place of conventional combinations of volatile and non-volatile memory described in the preceding background can provide an advantageous combination of speed and persistence, without undue size and/or circuit complexity. The present invention may also find beneficial application in other applications. For example, many applications may utilize variable-persistence memory cells as described herein to implement power-saving regimes or other features.

DETAILED DESCRIPTION

The present invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like items throughout. It will be understood that when structures are referred to as being coupled to one another, this coupling may be direct or via one or more intervening structures.

According to some embodiments of the invention, variable-persistence molecular memory cells may be provided by using a combination of first and second charge storage molecules linked to an electrode of the cell by a molecular linkage that provides respective first and second electron transfer rates for the first and second charge storage molecules. Differing oxidation potentials and/or electron transfer rates for the first and second charge storage molecules can allow the charge storage molecules to be independently accessed for reading and/or writing. Different electron transfer rates for the first and second charge storage molecules may also be used to provide different levels of persistence for the respective charge storage molecules. Memory cells with multiple speeds, programming voltages and/or levels of volatility can thereby be provided.

Figure 9:
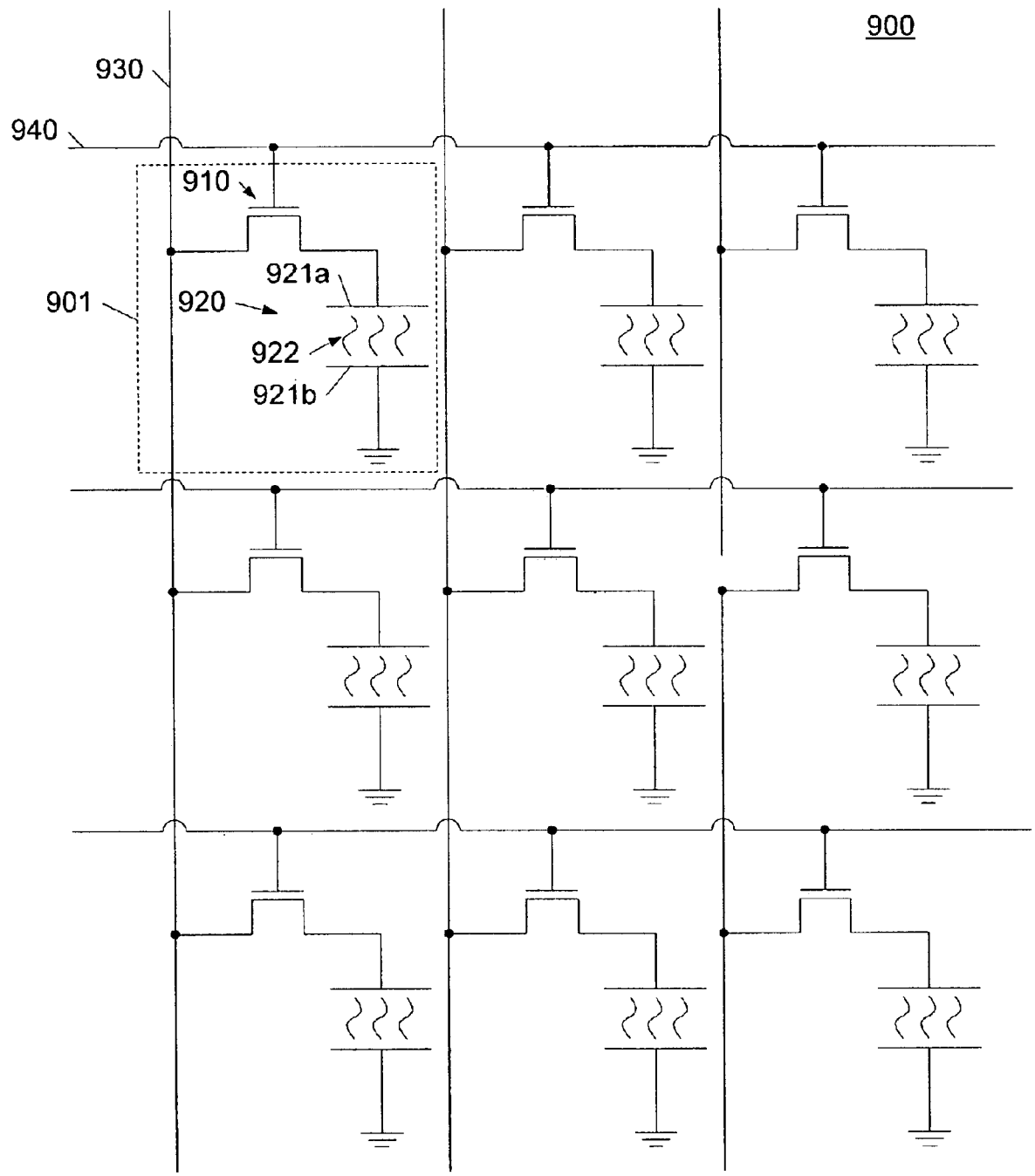
FIG. 9 illustrates an exemplary DRAM-type architecture according to further embodiments of the present invention.
Figure 10:
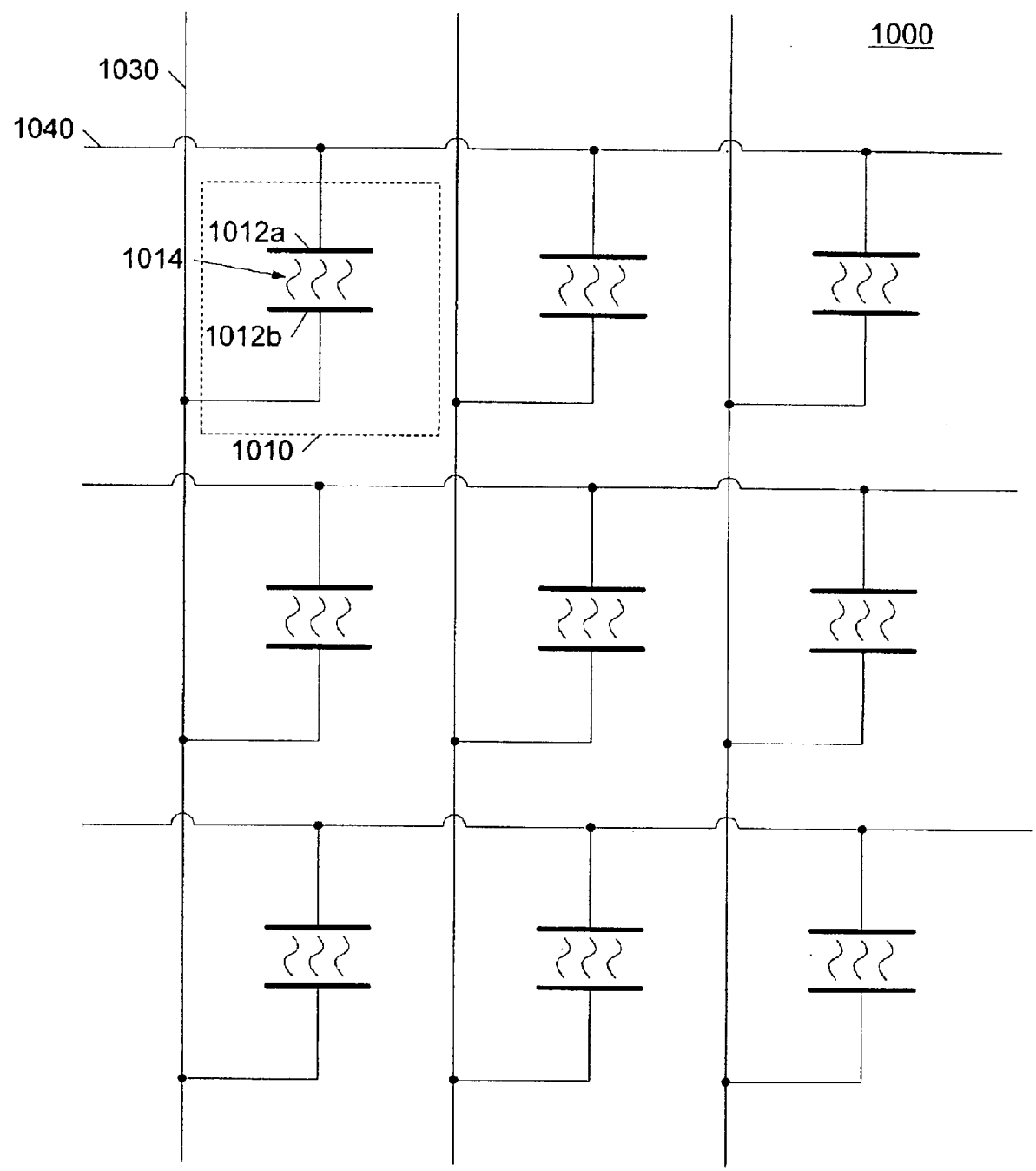
FIG. 10 illustrates an exemplary electrochemical cell array architecture according to further embodiments of the present invention.

According to some embodiments of the invention, variable-persistence molecular transistors are provided. Such transistors can be used, for example, to implement a variable-persistence memory using, for example, a cell array structure similar to that used in flash memory devices. Memory cells according to the invention can be embodied in other ways, e.g., in other forms of electrochemical cell arrays, such as those having a structure similar to that of a DRAM or a crossbar conductor structure, as shown in FIGS. 9 and 10. It will be appreciated that other structures may fall within the scope of the present invention.

Figure 1:
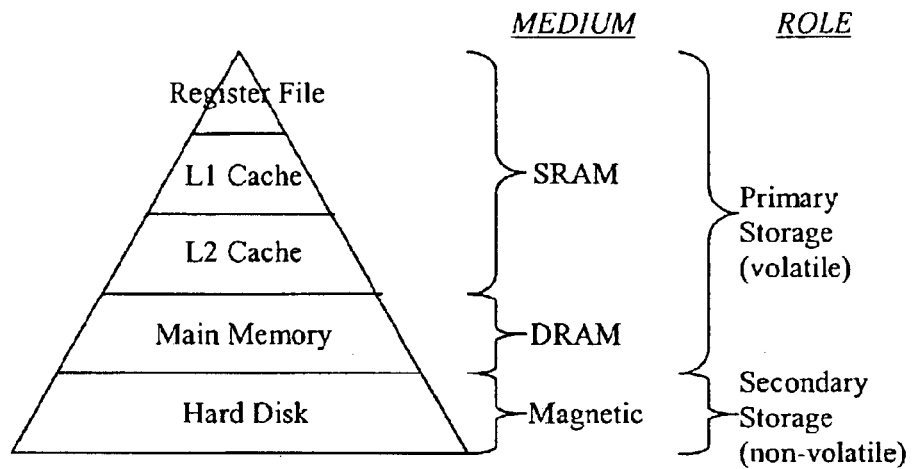
FIG. 1 illustrates a conventional memory organization.
Figure 2:
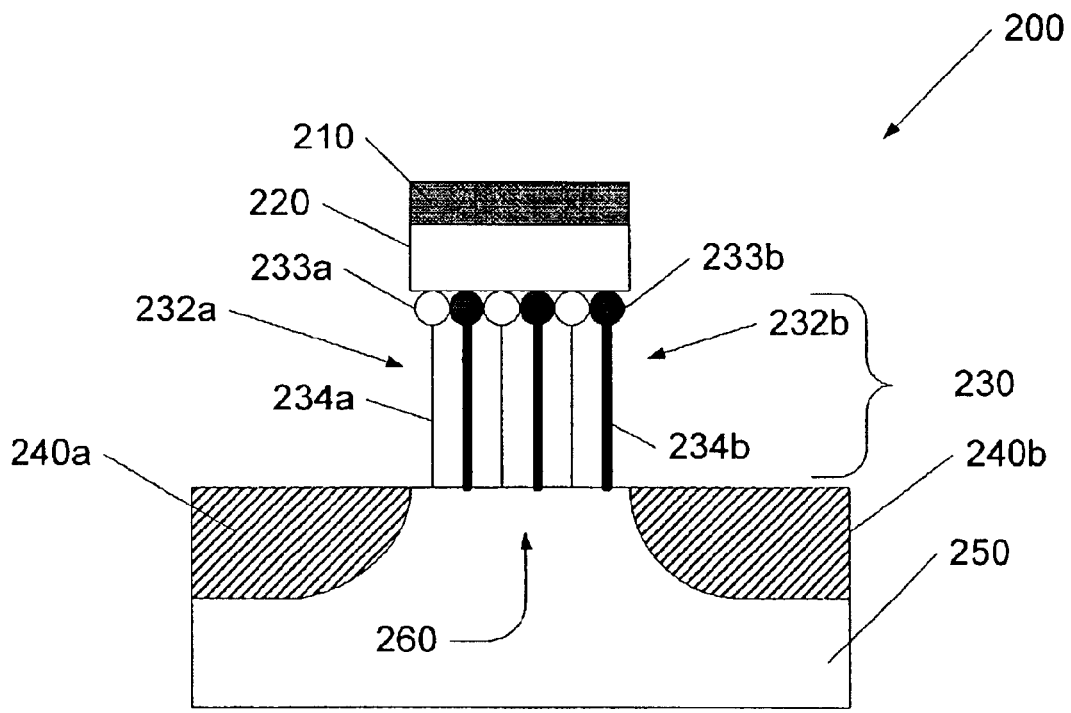
FIG. 2 illustrates a variable-persistence molecular memory transistor according to some embodiments of the present invention.

FIG. 2 illustrates a variable-persistence molecular transistor 200 according to some embodiments of the present invention. The transistor includes a substrate 250 (e.g., p-type silicon), in which source/drain regions 240a, 240b are formed. A gate structure of the transistor 200 includes a gate electrode 210. A molecular information storage element 230 attaches to an electrolyte 220 underlying the gate electrode. The molecular information storage element 230 includes first charge storage molecules 232a including first charge storage units 233a linked by first linkers 234a to a channel region 260, i.e., a portion of the substrate disposed between the source/drain regions 240a, 240b that supports formation of a channel. The molecular information storage element 230 further includes second charge storage molecule 232b including second charge storage units 233b, linked to the channel region 260 by second linkers 234b.

The first and second charge storage units 232a, 232b may have respective different oxidation potentials, such that they can be independently programmed by application of selected potentials between the gate electrode 210 and the source/drain regions 240a, 240b. The first and second linkers 234a, 234b may provide respective different electron transfer rates to and from the first and second charge storage units 233a, 233b, such that the information storage element 230 can have multiple program/erase rates and multiple leakage rates. Thus, for example, if the second linker 234b provides a lower electron transfer rate than the first linker 234a, the first charge storage molecules 232a can be used as fast, "volatile" storage, e.g., storage that may be quickly accessed, but that will quickly discharge and may require refreshing, while the second charge storage molecules 232b may serve as slower, non-volatile or less volatile storage.

According to the embodiments illustrated in FIG. 2, the information storage element 230 includes an admixture of at least two types of charge storage molecules, e.g., a first charge storage molecule 232a including the first charge storage unit 233a and the first linker 234a, and a second charge storage molecule 232b including the second charge storage unit 233b and the second linker 234b, each of which are separately coupled to the channel region 260 of the substrate 250. Although an admixture of two types of information storage molecules is illustrated in FIG. 2, it will be appreciated that admixtures of more than two types of information storage molecules may also be used within the scope of the invention.

The linkers 234a, 234b may include surface attachment groups that are configured to attach the linkers 234a, 234b to the channel region 260. A gate electrolyte 220 may be disposed between the charge storage molecules 232a, 232b and the gate electrode 210. The electrolyte can be, for example, a solution (e.g., $Bu_4NPF_6$ in $CH_2Cl_2$ solution; $LiClO_4$ in $CH_3CN$), a gel (e.g., $Bu_4NPF_6$ in propylene carbonate followed by solvent evaporation), or a polymer gel (e.g., polypropylene oxide containing $LiN(CF_3SO_2)_2$). Although the embodiments of FIG. 2 are shown as including a gate electrolyte 220, in further embodiments of the invention, the gate electrolyte 220 may be eliminated such that the charge storage units 233a, 233b are directly attached to the gate electrode 210. Capping groups may be present or absent from the charge storage molecules 232a, 232b, as required to attach the charge storage units 233a, 233b to the electrolyte 220 or the gate electrode 210.

The charge storage molecules 232a, 232b can provide single bit or multi-bit storage, depending on the number of oxidation states the charge storage units 233a, 233b possess. Discrimination in writing/reading to the first and second charge storage molecules 232a, 232b may be achieved by differences in rates of electron transfer (kinetics) and/or differences in oxidation potentials (thermodynamics).

Preferably, the potential for each oxidation state in the second charge storage unit 233b is greater than that of any oxidation state in the first charge storage unit 233a.

A difference in rate of electron transfer may be achieved by differences in the linkers 234a, 234b. In general, for a given structural type, longer linkers afford slower electron-transfer rates. In addition, for a given length, linkers with larger HOMO-LUMO (highest occupied molecular orbital-lowest unoccupied molecular orbital) gaps than that of the charge storage unit may afford slower rates. Appropriate choices of linker length and HOMO-LUMO gap may enable electron-transfer rates to be obtained that are suitable for the desired design. The surface attachment moieties of the linkers 234a, 234b and/or the capping groups of the first and second charge storage units 233a, 233b may also affect electron transfer rates.

Charge storage units are, in general, covalently bonded to the linkers, which are in turn covalently bonded to an electrode, but it will be appreciated that other types of bonds may be used within the scope of the present invention. Charge storage molecules and/or associated nomenclature applicable to the present invention are generally described in U.S. Pat. No. 6,451,942 to Li et al.; U.S. Pat. No. 6,420,648 to Lindsey; U.S. Pat. No. 6,407,330 to Lindsey et al.; U.S. Pat. No. 6,381,169 to Bocian et al.; U.S. Pat. No. 6,324,091 to Gryko et al.; U.S. Pat. No. 6,272,038 to Clausen et al.; U.S. Pat. No. 6,212,093 to Lindsey; U.S. Pat. No. 6,208,553 to Gryko et al.; U.S. patent application Ser. No. 10/193,827, to Lindsey et al., entitled Substrates Carrying Polymers of Linked Sandwich Coordination Compounds and Methods of Use Thereof; U.S. patent application Ser. No. 09/670,463 to Lindsey et al., entitled Trans Beta Substituted Chlorins and Methods of Making and Using the Same; U.S. patent application Ser. No. 09/852,560 (Publication No. 2002-0033192) to Lindsey et al., entitled Trans Beta Substituted Chlorins and Methods of Making and Using the Same; U.S. patent application Ser. No. 10/011,121 (Publication No. 2002-0137925) to Lindsey et al., entitled Regioisomerically Pure Oxochlorins and Methods of Synthesis; U.S. patent application Ser. No. 10/141,654 to Lindsey et al. entitled Solar Cells Incorporating Light Harvesting Arrays; U.S. patent application Ser. No. 10/135,220 to Lindsey et al., entitled Rational Syntheses of Heteroleptic Lanthanide Sandwich Coordination Complexes; U.S. patent application Ser. No. 10/140,654 to Lindsey et al., entitled Refined Routes to Chlorin Building Blocks; U.S. patent application Ser. No. 09/932,196 to Lindsey et al., entitled Convergent Synthesis of Multiporphyrin Light-Harvesting Rods; U.S. patent application Ser. No. 09/962,742 to Lindsey et al., entitled Methods of Making Porphyrins and Related Compounds with Lewis Acids; U.S. patent application Ser. No. 10/164,474 to Lindsey, entitled Soluble Perylene-Porphyrin Building Blocks for Use in Light-Harvesting Rods; U.S. patent application Ser. No. 10/040,059, filed Oct. 26, 2001 to Bocian et al., entitled Formation of Self-Assembled Monolayers on Silicon Substrates; U.S. patent application Ser. No. 10/017,999, filed Feb. 26, 2002 to Misra et al., entitled Method and System for Molecular Charge Storage Field Effect Transistor; U.S. patent application Ser. No. 10/079,938, filed Feb. 19, 2002 to Lindsey et al., entitled Multistate Triple-Decker Dyads in Three Distinct Architectures for Information Storage Applications; and U.S. patent application Ser. No. 10/098,996, filed Mar. 14, 2002 to Kuhr et al., entitled Open Circuit Potential Amperometry and Voltammetry, all of which are incorporated by reference herein.

Linkers that may be used for the first and second linkers according to some embodiments of the invention include methyl, ethyl, propyl, butyl, 1,4-phenylene, 1,4-phenylethyne, ethyne, 4,4'-diphenylethyne, 4,4'-diphenylbutadiyne, 4,4'-biphenyl, 4,4'-stilbene, 1,4-bicyclooctane, 4,4'-azobenzene, 4,4'-benzylideneaniline, 4,4''-terphenyl, 4,4'''-quatterphenyl, 1,4-bicyclo[2.2.2]octane, 1,4-adamantane, and combinations thereof. Linkers may also include cholestane (steroidal) units or other structurally rigid aliphatic molecules. A charge storage unit can also be attached without a linker (i.e., carbon-carbon single bond).

Surface attachment moieties may be a protected or unprotected reactive site or groups on the linker, and include the following: carboxy, hydroxy, mercapto, selenyl, telluryl, vinyl, dihydroxyphosphoryl, hydroxy(mercapto) phosphoryl, cyano, and amino group. Alternatively, no attachment group may be needed. It will be understood that loss of a proton, cleavage of a protecting group, loss of a labile group, or change in valency on the reactive site may occur upon attachment to the surface.

Examples of linkers/surface attachment combinations may include, but are not limited to: 4-carboxyphenyl, 2-(4-carboxyphenyl)ethynyl, 4-(2-(4-carboxyphenyl)ethynyl) phenyl, 4-carboxymethylphenyl, 4-(2-(4-carboxymethylphenyl)ethynyl)phenyl; 4-hydroxyphenyl, 2-(4-hydroxyphenyl)ethynyl, 4-(2-(4-hydroxyphenyl) ethynyl)phenyl, 4-hydroxymethylphenyl, 4-(2-(4-hydroxymethylphenyl)ethynyl)phenyl; 4-mercaptophenyl, 2-(4-mercaptophenyl)ethynyl, 4-(2-(4-mercaptophenyl) ethynyl)phenyl, 4-mercaptomethylphenyl, 4-(2-(4-mercaptomethylphenyl)ethynyl)phenyl; 4-selenylphenyl, 2-(4-selenylphenyl)ethynyl, 4-(2-(4-selenylphenyl)ethynyl) phenyl, 4-selenylmethylphenyl, 4-(2-(4-selenylphenyl) ethynyl)phenyl; 4-tellurylphenyl, 2-(4-tellurylphenyl) ethynyl, 4-(2-(4-tellurylphenyl)ethynyl)phenyl, 4-tellurylmethylphenyl, 4-(2-(4-tellurylmethylphenyl) ethynyl)phenyl; 4-vinylphenyl, 4-allylphenyl, 2-(4-vinylphenyl)ethynyl, 4-(2-(4-vinylphenyl)ethynyl)phenyl, 4-allylphenyl, 4-(2-(4-allylphenyl)ethynyl)phenyl, 4-(dihydroxyphosphoryl)phenyl, 2-[4-(dihydroxyphosphoryl)phenyl]ethynyl, 4-[2-[4-(dihydroxyphosphoryl)phenyl]ethynyl]phenyl, 4[(dihydroxyphosphoryl)methyl]phenyl, 4-[2-(dihydroxyphosphoryl)ethyl]phenyl, 4-[2-[4-(dihydroxyphosphoryl)methylphenyl]ethynyl]phenyl; 4-(hydroxy(mercapto)phosphoryl)phenyl, 2-[4-(hydroxy (mercapto)phosphoryl)phenyl]ethynyl, 4-[2-[4-(hydroxy (mercapto)phosphoryl)phenyl]ethynyl]phenyl, 4[(hydroxy (mercapto)phosphoryl)methyl]phenyl, 4-[2-(hydroxy (mercapto)phosphoryl)ethyl]phenyl, 4-[2-[4-(hydroxy (mercapto)phosphoryl)methyl]phenyl, ethynyl]phenyl; 4-cyanophenyl, 2-(4-cyanophenyl)ethynyl, 4-[2-(4-cyanophenyl)ethynyl]phenyl, 4-(cyanomethyl)phenyl, 4-(2-cyanoethyl)phenyl, 4-[2-[4-(cyanomethyl)phenyl]ethynyl] phenyl, 4-cyanobiphenyl, 4-aminophenyl, 2-(4-aminophenyl)ethynyl, 4-[2-(4-aminophenyl)ethynyl] phenyl, and 4-aminobiphenyl. Synthesis techniques for such linkers are known to those skilled in the art, as described, for example, in: "Thiol-Derivatized Porphyrins for Attachment to Electroactive Surfaces," Gryko, D. T.; Clausen, P. C.; Lindsey, J. S. *J. Org. Chem.* 1999, 64, 8635–8647; "Synthesis of "Porphyrin-Linker-Thiol" Molecules with Diverse Linkers for Studies of Molecular-Based Information Storage," Gryko, D. T.; Clausen, C.; Roth, K. M.; Dontha, N.; Bocian, D. F.; Kuhr, W. G.; Lindsey, J. S. *J. Org. Chem.* 2000, 65, 7345–7355; "Synthesis of Thiol-Derivatized Ferrocene-Porphyrins for Studies of Multibit Information Storage," Gryko, D. T.; Zhao, F.; Yasseri, A. A.; Roth, K. M.;

Bocian, D. F.; Kuhr, W. G.; Lindsey, J. S. *J. Org. Chem.* 2000, 65, 7356–7362; "Synthesis of Thiol-Derivatized Porphyrin Dimers and Trimers for Studies of Architectural Effects on Multibit Information Storage," Clausen, C.; Gryko, D. T.; Dabke, R. B.; Dontha, N.; Bocian, D. F.; Kuhr, W. G.; Lindsey, J. S. *J. Org. Chem.* 2000, 65, 7363–7370; "Investigation of Tightly Coupled Porphyrin Arrays Comprised of Identical Monomers for Multibit Information Storage," Clausen, C.; Gryko, D. T.; Yasseri, A. A.; Diers, J. R.; Bocian, D. F.; Kuhr, W. G.; Lindsey, J. S. *J. Org. Chem.* 2000, 65, 7371–7378; "Synthesis of Thiol-Derivatized Europium Porphyrinic Triple-Decker Sandwich Complexes for Multibit Molecular Information Storage," Li, J.; Gryko, D.; Dabke, R. B.; Diers, J. R.; Bocian, D. F.; Kuhr, W. G.; Lindsey, J. S. *J. Org. Chem.* 2000, 65, 7379–7390; and "Molecular Rods: Synthesis and Properties," Zimmerman, H. E.; King, R. K.; Meinhardt, M. B. *J. Org. Chem.* 1992, 57, 5484–5492. Those skilled in the art will appreciate that the nomenclature applied to these exemplary linkers presupposes single bonding of the linker, but that the nomenclature applied to a linker generally depends on the nature in which the linker is bonded to other structures. Accordingly, the present invention includes not only the linkers as recited above, but also structural equivalents that may bear different names due to different bonding arrangements.

A wide variety of structures can be used as charge storage units. These may include, but are not limited to, porphyrinic macrocycles, metallocenes, linear polyenes, cyclic polyenes, tetrathiafulvalenes, tetraselenafulvalenes, metal coordination complexes, sandwich coordination compounds, triarylamines, 1,4-phenylenediamines, xanthenes, flavins, phenazines, phenothiazines, acridines, quinolines, 2,2'-bipyridyls, 4,4'-bipyridyls, tetrathiotetracenes, and peri-bridged naphthalene dichalcogenides. Linear and cyclic polyenes as described herein may be unsubstituted or substituted with one or more heteroatoms such as N, O, or S. Sandwich coordination compounds as described herein may include, but are not limited to, lanthanide sandwich coordination compounds, and may be double or triple-decker sandwich coordination compounds. Preferred structures include a porphyrin, a ferrocene, and a lanthanide porphyrinic triple-decker sandwich coordination compound. Synthesis techniques for such charge storage units are known to those skilled in the art, as described, for example, in: "Rational Syntheses of Porphyrins Bearing up to Four Different Meso Substituents," Rao, P. D.; Dhanalekshmi, S.; Littler, B. J.; Lindsey, J. S. *J. Org. Chem.* 2000, 65, 7323–7344; "Synthesis of "Porphyrin-Linker-Thiol" Molecules with Diverse Linkers for Studies of Molecular-Based Information Storage," Gryko, D. T.; Clausen, C.; Roth, K. M.; Dontha, N.; Bocian, D. F.; Kuhr, W. G.; Lindsey, J. S. *J. Org. Chem.* 2000, 65, 7345–7355; "Synthesis of Thiol-Derivatized Ferrocene-Porphyrins for Studies of Multibit Information Storage," Gryko, D. T.; Zhao, F.; Yasseri, A. A.; Roth, K. M.; Bocian, D. F.; Kuhr, W. G.; Lindsey, J. S. *J. Org. Chem.* 2000, 65, 7356–7362; "Synthesis of Thiol-Derivatized Porphyrin Dimers and Trimers for Studies of Architectural Effects on Multibit Information Storage," Clausen, C.; Gryko, D. T.; Dabke, R. B.; Dontha, N.; Bocian, D. F.; Kuhr, W. G.; Lindsey, J. S. *J. Org. Chem.* 2000, 65, 7363–7370; "Investigation of Tightly Coupled Porphyrin Arrays Comprised of Identical Monomers for Multibit Information Storage," Clausen, C.; Gryko, D. T.; Yasseri, A. A.; Diers, J. R.; Bocian, D. F.; Kuhr, W. G.; Lindsey, J. S. *J. Org. Chem.* 2000, 65, 7371–7378; "Synthesis of Thiol-Derivatized Europium Porphyrinic Triple-Decker Sandwich Complexes for Multibit Molecular Information Storage," Li, J.; Gryko, D.; Dabke, R. B.; Diers, J. R.; Bocian, D. F.; Kuhr, W. G.; Lindsey, J. S. *J. Org. Chem.* 2000, 65, 7379–7390; "Studies Related to the Design and Synthesis of a Molecular Octal Counter," Gryko, D.; Li, J.; Diers, J. R.; Roth, K. M.; Bocian, D. F.; Kuhr, W. G.; Lindsey, J. S. *J. Mater. Chem.* 2001, 11, 1162–1180; "Investigation of Rational Syntheses of Heteroleptic Porphyrinic Lanthanide (Europium, Cerium) Triple-Decker Sandwich Complexes," Gross, T.; Chevalier, F.; Lindsey, J. S. *Inorg. Chem.* 2001, 40, 4762–4774; "Design, Synthesis, and Characterization of Prototypical Multistate Counters in Three Distinct Architectures," Schweikart, K.-H.; Malinovskii, V. L.; Diers, J. R.; Yasseri, A. A.; and Bocian, D. F.; Kuhr, W. G.; Lindsey, J. S. *J. Mater. Chem.* 2002, 12, 808–828.

Figure 3:
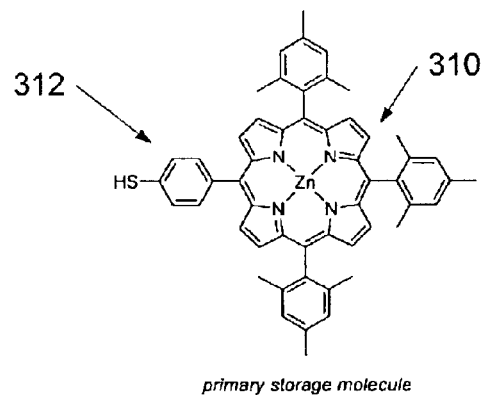
FIGS. 3 and 4 illustrate exemplary information storage molecules for variable-persistence memory cells according to various embodiments of the present invention.
Figure 3:
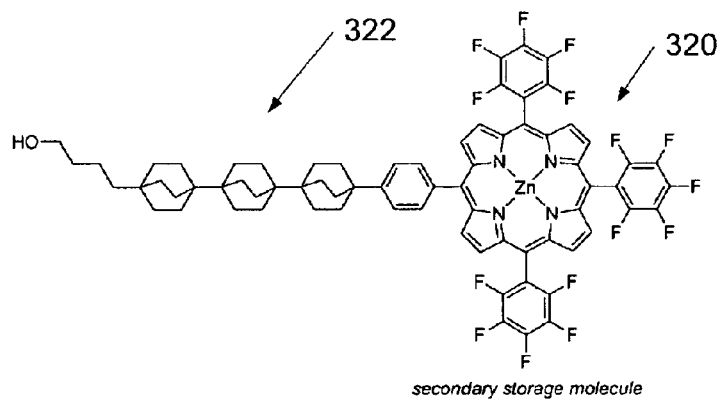

Examples of charge storage molecules for use in some embodiments of the present invention, such as those illustrated in FIG. 2, are shown in FIG. 3. In this example, a primary charge storage unit 310 has a relatively short linker 312 coupled thereto including a p-phenylene unit with a thiol surface attachment moiety. A secondary charge storage unit 320 has a much longer linker 322 attached thereto, which includes a butyl chain, three 1,4-bicyclooctane units, and a p-phenylene unit, with an alcohol surface attachment moiety. The length and saturation of much of the linker 322 may provide a much slower rate of electron transfer between the charge storage unit 320 and a surface.

As shown, the charge storage units 310, 320 are both zinc porphyrins, but the porphyrin in the primary charge storage unit 310 bears three mesityl groups while the porphyrin in the secondary storage molecule 320 bears three pentafluorophenyl groups. The former is expected to have first and second oxidation potentials at<0.9 V vs. Ag/Ag$^+$, while the latter is expected to have first and second oxidation potentials at>0.9 V vs. Ag/Ag$^+$, such that information may be written to the primary storage molecule 310 at potentials that do not affect the secondary storage molecule 320. It will be appreciated that other peripheral substituents and central metal atoms may be used in metalloporphyrins to achieve desired oxidation potentials.

Figure 4:
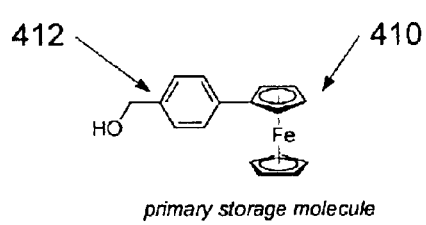
Figure 4:
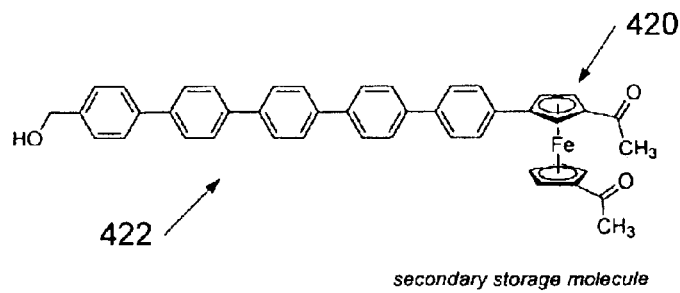

Other exemplary molecules that could be used in the embodiments of FIG. 2 are shown in FIG. 4. Primary and secondary charge storage units 410, 420 both employ a ferrocene moiety, and are attached to respective p-phenylene linkers 412, 422 of different lengths. The oxidation potential of the ferrocene in the secondary charge storage unit 420 is shifted to a more positive potential than that of the first charge storage unit 410 by incorporation of two acetyl groups. It will be understood that, in general, electron-withdrawing groups (e.g., chloro, fluoro, methanesulfonyl, trifluoromethanesulfonyl, trifluoroacetyl, formyl, methoxycarbonyl, benzoyl) and electron-releasing groups (e.g., methyl, ethyl, alkyl, methoxy, ethoxy, p-methoxyphenyl) can be added to one or both of the charge storage units 410, 420, alone or in combination; such groups are well known to those skilled in the art. The ferrocene molecules afford a single cationic oxidation state and, thus, can be used as single-bit storage molecules.

Figure 5:
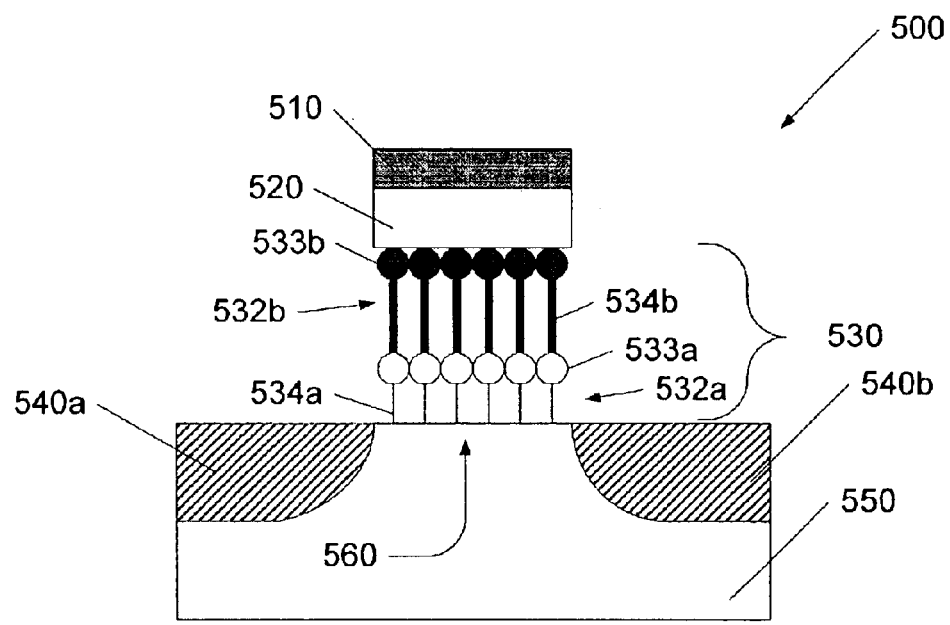
FIG. 5 illustrates a variable-persistence molecular memory transistor according to further embodiments of the present invention.

FIG. 5 illustrates a variable-persistence molecular transistor 500 according to further embodiments of the present invention. The transistor 500 includes a substrate 550 (e.g., p-type silicon), in which source/drain regions 540a, 540b (e.g., n-doped silicon) are formed. A gate structure of the transistor 500 includes a gate electrode 510, an electrolyte 520 and a bipartite molecular information storage element 530. The bipartite molecular information storage element 530 includes first charge storage molecules 532a including first charge storage units 533a linked by first linkers 534a to a channel region 560 disposed between the source/drain regions 540a, 540b. The information storage element 530 further includes second charge storage molecules 532b including second charge storage units 533b linked to the first charge storage units 533a by second linkers 534b. The first and second charge storage units 533a, 533b may have respective different oxidation potentials, such that they can be independently programmed by application of selected potentials between the gate electrode 510 and the source/drain regions 540a, 540b. The first and second linkers 534a, 534b may provide respective different electron transfer rates to and from the first and second charge storage units 533a, 533b, such that the molecular information storage element 530 has multiple program/erase rates and multiple leakage rates. Thus, for example, if the second linker 534b provides a lower electron transfer rate than the first linker 534a, the first charge storage molecules 532a can be used as fast, "volatile" storage, e.g., storage that may be quickly accessed, but that will quickly discharge and may require refreshing, while the second charge storage molecules 532b may serve as slower, non-volatile or less volatile storage.

Figure 6:
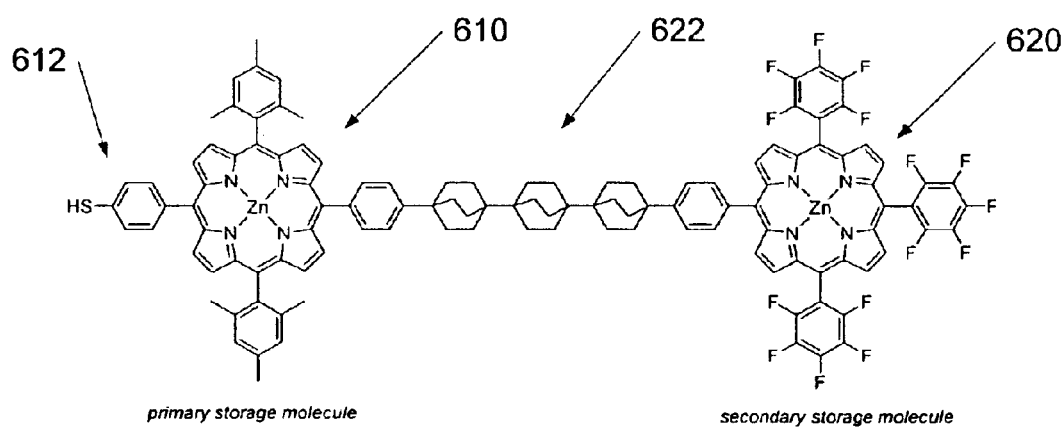
FIG. 6 illustrates exemplary information storage molecules for variable-persistence memory cells according to further embodiments of the present invention.

An exemplary bipartite molecular structure that may be used in the transistor 500 of FIG. 5 is illustrated in FIG. 6. In this example, the primary and second charge storage units 610, 620 are similar to those illustrated in FIG. 3, but have been incorporated into a bipartite molecular structure. The primary charge storage unit 610 has a short linker 612 attached thereto including a p-phenylene unit with thiol surface attachment moiety. The secondary charge storage unit 620 has a much longer linker 622 attached thereto including a p-phenylene unit, three 1,4-bicyclooctane units, and a p-phenylene unit. A potential advantage of the use of a bipartite molecular design compared with an admixture of molecules in a memory cell is that the homogeneity of the monolayer upon surface derivatization may be more readily achieved.

It will be appreciated that a variety of other constructs, such as those employing triple-decker lanthanide porphyrinic sandwich coordination compounds, can also be used in various embodiments of the invention. Furthermore, the redox-active units used for charge storage need not necessarily be of the same types, as described in the exemplary embodiments. For example, a metallocene can be employed for primary storage, while a porphyrinic macrocycle can be employed for secondary, less volatile storage. Moreover, a single charge-storage molecule can be used for primary storage, where long retention times may not be necessary, while an oligomer of charge-storage molecules can be employed for secondary storage. The use of an oligomer of charge-storage molecules may allow a large amount of charge to be stored as part of the secondary storage process.

Figure 7:
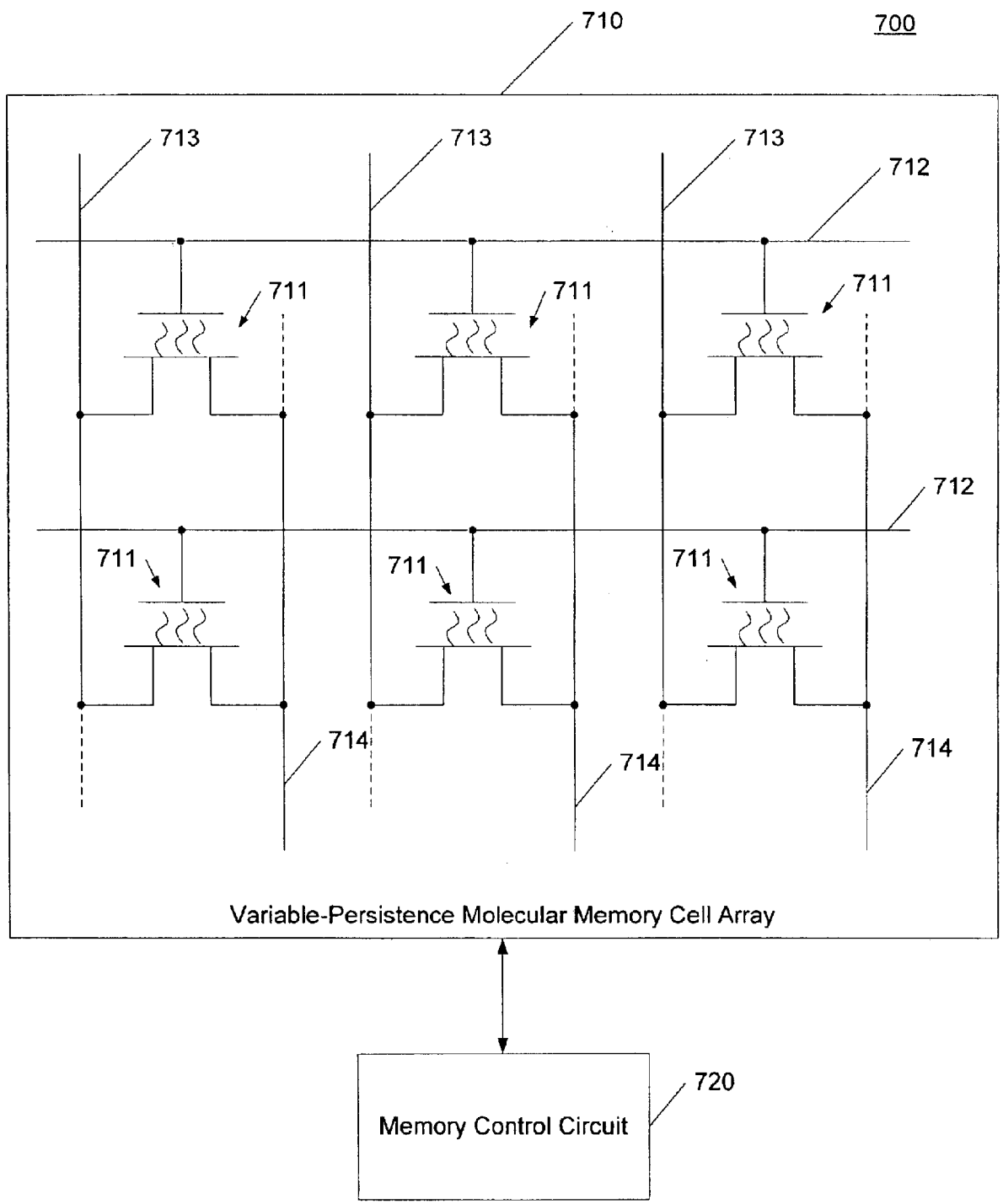
FIG. 7 illustrates an exemplary memory device according to some embodiments of the present invention.

FIG. 7 illustrates an exemplary memory device 700 according to some embodiments of the present invention, which uses variable-persistence memory cells 711, such as those described above with reference to FIGS. 2–6. The memory cells 711 are included in a variable-persistence memory cell array 710, and are coupled to word lines 712, bit lines 713 and source lines 714 in a configuration similar to that used for conventional flash memory arrays that use conventional floating gate transistors. The word lines 712, bit lines 713 and source lines 714 may be controlled by a memory control circuit 720, e.g., a circuit operative to provide the appropriate potentials at the terminals of the transistors 711 to program/erase selected ones of primary and secondary charge storage molecules in the transistors 711.

Figure 8:
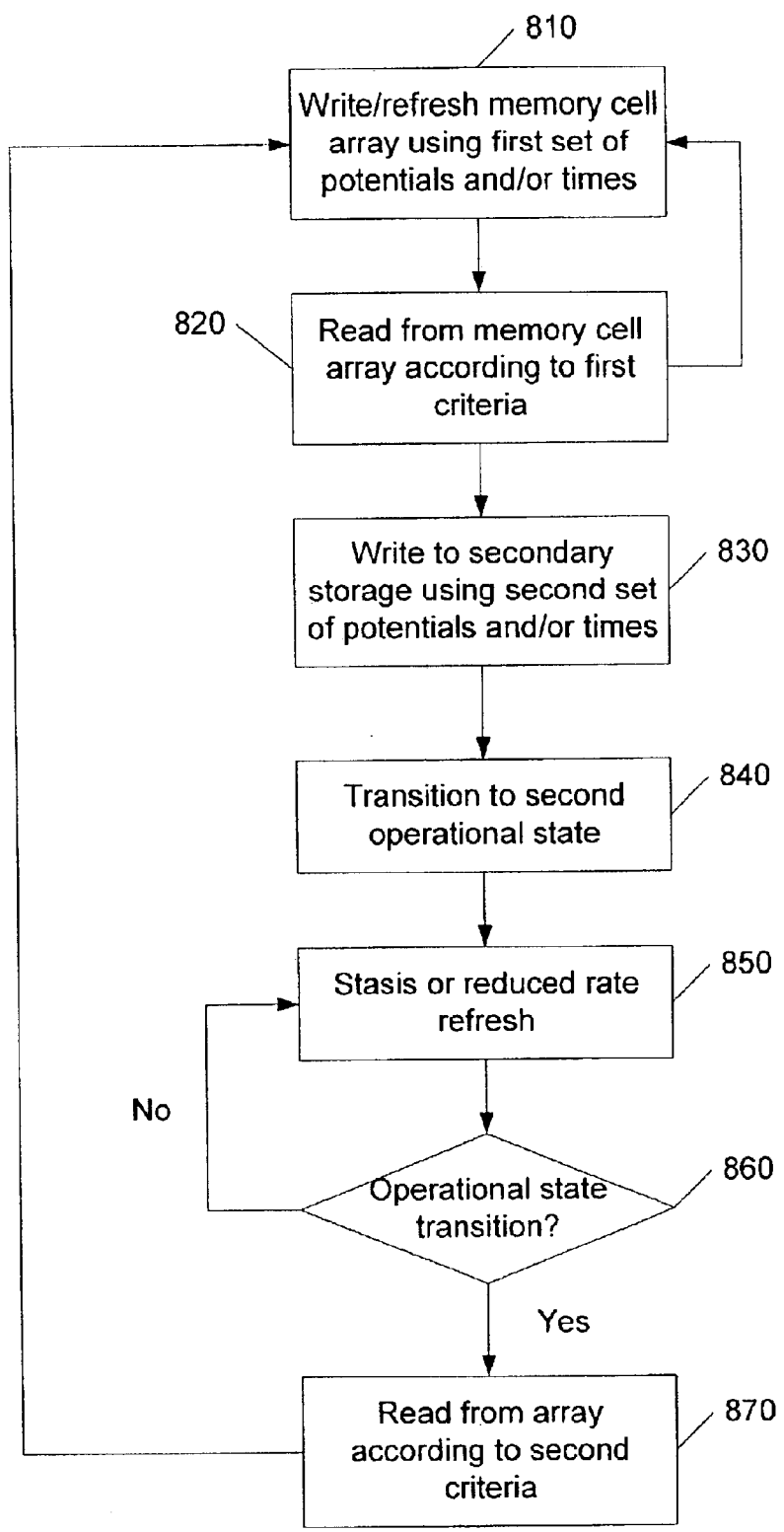
FIG. 8 illustrates exemplary operations of the memory device of FIG. 7.

FIG. 8 illustrates exemplary operations that might be used with a variable-persistence molecular memory device, such as the memory device 700 of FIG. 7. In a first operational mode, e.g., a normal, full-powered active mode, the transistors 711 of the memory cell array 710 are programmed/erased (or refreshed) using a first set of potentials and/or program/erase times applied to the transistors 711 such that the more volatile primary information storage molecules of the transistors 711 are programmed and/or erased (Block 810). Information stored in the transistors 711 may be read from the memory cell transistors 711 according to first criteria, e.g., first threshold voltage criteria, that are associated with the states of the primary storage molecules (Block 820). It will be appreciated that these operations (Blocks 810, 820) may repeatedly occur.

Sometime before transition to a second operational state, such as a powered down or lower-power "sleep" state, information stored in the primary storage molecules of the transistors 711 is written to the secondary storage molecules of the transistors 711, e.g., by using different potentials and/or program/erase times (Block 830). Such saving of data may occur, for example, in response to initiation of a shutdown sequence and/or upon detection of a power failure. After transition to the second operational state (Block 840), the secondary charge storage molecules may retain the stored data without refresh, or with a reduced refresh rate (Block 850). Upon detection of a transition back to the active state (Block 860), information stored in the secondary storage molecules of the transistors 711 may be read according to second criteria (Block 870), and programmed back into the primary storage molecules, which may be more quickly read and/or modified during normal operation (Blocks 810, 820).

It will be appreciated that the memory architecture and operations described above with reference to FIGS. 7 and 8 are offered for exemplary purposes, and that a variety of other memory architectures and/or operations can be used with the present invention. For example, instead of a transistor array, such as the transistor array 710 of FIG. 7, variable-persistence molecular information storage elements according to the present invention may be used in other types of electrochemical cell arrangements, such as an array of electrochemical cells controlled by a conductor array, as in a crossbar array, or an array of molecular capacitors, similar to structures in a conventional DRAM. It will be appreciated that such arrangements may utilize different programming/reading circuitry and/or operations than those described above.

For example, an exemplary DRAM-like molecular memory cell array 900 according to further embodiments of the present invention is illustrated in FIG. 9. The memory array 900 includes a plurality of memory cells 901 coupled to bit lines 930 and word lines 940. Each memory cell 901 includes an access transistor 910 that controls a molecular storage capacitor 920. As shown, the molecular storage capacitor 920 includes first and second electrodes 921a, 921b and a variable-persistence memory storage element 922 disposed therebetween. It will be appreciated that the molecular storage element 922 may comprise a combination of first and second (or more) charge storage molecules, as described above.

An exemplary molecular crossbar array 1000 according to further embodiments of the present invention is illustrated in FIG. 10. The array 1000 includes an array of conductors 1030, 1040 (e.g., a crossbar array) that are coupled to electrochemical cells 1010. Each of the cells 1010 includes first and second electrodes 1012a, 1012b coupled to respective ones of the conductors 1030, 1040 and a variable-persistence molecular storage element 1014 disposed therebetween. It will be appreciated that the molecular storage element 1014 may comprise a combination of first and second (or more) charge storage molecules, as described above.

In the drawings and specification, there have been disclosed typical embodiments of the invention. Although specific terms are employed, they are used in a generic and descriptive sense only and not for purposes of limitation.

That which is claimed:

1. A molecular memory cell, comprising:
   first and second electrodes; and
   first and second charge storage molecules disposed between the first and second electrodes and coupled to the first electrode by a molecular linkage that provides respective first and second electron transfer rates for the first and second charge storage molecules that differ such that the first and second charge storage molecules have different data storage persistence levels.

2. A molecular memory cell according to claim 1, wherein the first electrode is coupled to a channel region of a molecular transistor, and wherein the second electrode is a gate electrode of the molecular transistor.

3. A molecular memory cell according to claim 1, wherein the first and second electrodes are coupled to first and second conductors of a conductor array.

4. A molecular memory cell according to claim 1, further comprising an access transistor coupled to one of the first and second electrodes.

5. A molecular memory cell according to claim 1, wherein the first and second charge storage molecules comprise respective first and second charge storage units independently selected from a group consisting of porphyrinic macrocycles, metallocenes, linear polyenes, cyclic polyenes, tetrathiafulvalenes, tetraselenafulvalenes, metal coordination complexes, sandwich coordination compounds, triarylamines, 1,4-phenylenediamines, xanthenes, flavins, phenazines, phenothiazines, acridines, quinolines, 2,2'-bipyridyls, 4,4'-bipyridyls, tetrathiotetracenes, and pen-bridged naphthalene dichalcogenides.

6. A molecular memory cell according to claim 5, wherein the molecular linkage comprises first and second linkers that control electron transfer to and from respective ones of the first and second charge storage units, and wherein the first and second linkers are independently selected from a group consisting of 4-carboxyphenyl, 2-(4-carboxyphenyl) ethynyl, 4-(2-(4-carboxyphenyl)ethynyl)phenyl, 4-carboxymethylphenyl, 4-(2-(4-carboxymethylphenyl) ethynyl)phenyl; 4-hydroxyphenyl, 2-(4-hydroxyphenyl) ethynyl, 4-(2-(4-hydroxyphenyl)ethynyl)phenyl, 4-hydroxymethylphenyl, 4-(2-(4-hydroxymethylphenyl) ethynyl)phenyl; 4-mercaptophenyl, 2-(4-mercaptophenyl) ethynyl, 4-(2-(4-mercaptophenyl)ethynyl)phenyl, 4-mercaptomethylphenyl, 4-(2-(4-mercaptomethylphenyl) ethynyl)phenyl; 4-selenylphenyl, 2-(4-selenylphenyl) ethynyl, 4-(2-(4-selenylphenyl)ethynyl)phenyl, 4-selenylmethylphenyl, 4-(2-(4-selenylphenyl)ethynyl) phenyl; 4-tellurylphenyl, 2-(4-tellurylphenyl)ethynyl,4-(2-(4-tellurylphenyl)ethynyl)phenyl, 4-tellurylmethylphenyl, 4-(2-(4-tellurylmethylphenyl)ethynyl)phenyl; 4-vinylphenyl, 4-allylphenyl, 2-(4-vinylphenyl)ethynyl, 4-(2-(4-vinylphenyl)ethynyl)phenyl, 4-allylphenyl, 4-(2-(4-allylphenyl)ethynyl)phenyl, 4-(dihydroxyphosphoryl) phenyl, 2-[4-(dihydroxyphosphoryl)phenyl]ethynyl, 4-[2-[4-(dihydroxyphosphoryl)phenyl]ethynyl]phenyl, 4-[(dihydroxyphosphoryl)methyl]phenyl, 4-[2-(dihydroxyphosphoryl)ethyl]phenyl, 4-[2-(4-(dihydroxyphosphoryl)methylphenyl]ethynyl[phenyl; 4-(hydroxy(mercapto)phosphoryl)phenyl, 2-[4-(hydroxy (mercapto)phosphoryl)phenyl]ethynyl, 4-[2-[4-(hydroxy (mercapto)phosphoryl)phenyl]ethynyl]phenyl, 4-[(hydroxy (mercapto)phosphoryl)methyl]phenyl, 4-[2-(hydroxy (mercapto)phosphoryl)ethyl]phenyl, 4-[2-[4-(hydroxy (mercapto)phosphoryl)methylphenyl]ethynyl]phenyl; 4-cyanophenyl, 2-(4-cyanophenyl)ethynyl, 4-[2-(4-cyanophenyl)ethynyl]phenyl, 4-(cyanomethyl)phenyl, 4-(2-cyanoethyl)phenyl, 4-[2-[4-(cyanomethyl)phenyl]ethynyl] phenyl, 4-cyanobiphenyl, 4-aminophenyl, 2-(4-aminophenyl)ethynyl, 4-[2-(4-aminophenyl)ethynyl] phenyl, and 4-aminobiphenyl.

7. A molecular memory cell according to claim 5, wherein the molecular linkage comprises first and second linkers that control electron transfer to and from respective ones of the first and second charge storage units, and wherein the first and second linkers are independently selected from a group consisting of methyl, ethyl, propyl, butyl, 1,4-phenylene, 1,4-phenylethyne, ethyne, 4,4'-diphenylethyne, 4,4'-diphenylbutadiyne, 4,4'-biphenyl, 4,4'-stilbene, 1,4-bicyclooctane, 4,4'-azobenzene, 4,4'-benzylideneaniline, 4,4''-terphenyl, 4,4'''-quatterphenyl, 1,4-bicyclo[2.2.2] octane, and 1,4-adamantane.

8. A molecular memory cell according to claim 5, wherein the molecular linkage comprises first and second linkers that control electron transfer to and from respective ones of the first and second charge storage molecules, and wherein at least one of the first and second linkers comprises a structurally rigid aliphatic unit.

9. A molecular memory cell according to claim 5, wherein the molecular linkage comprises first and second linkers that control electron transfer to and from respective ones of the first and second charge storage molecules, and wherein at least one of the first and second linkers comprises a surface attachment moiety selected from a group consisting of carboxy, hydroxy, mercapto, selenyl, telluryl, vinyl, dihydroxyphosphoryl, hydroxy(mercapto)phosphoryl, cyano, and amino groups.

10. A molecular memory cell according to claim 5, wherein at least one of the first and second storage units is coupled to the first electrode without an intervening linker.

11. A molecular memory cell according to claim 1, wherein the first electron transfer rate is greater than the second electron transfer rate, and wherein the second charge storage molecule is operative to store a greater amount of charge than the first charge storage molecule.

12. A molecular memory cell according to claim 11, wherein the first charge storage molecule comprises a charge storage monomer, and wherein the second charge storage molecule comprises a charge storage polymer.

13. A molecular memory cell, comprising:
    first and second electrodes; and
    an admixture of charge storage molecules disposed between the first and second electrodes, the admixture comprising:
    a first charge storage molecule including a first charge storage unit having a first oxidation potential and a first linker that couples the first charge storage unit to the first electrode and that provides a first electron transfer rate for the first charge storage unit;
    a second charge storage molecule including a second charge storage unit having a second oxidation potential different from the first oxidation potential and a second linker that couples the second charge storage unit to the first electrode and that provides a second electron transfer rate for the second charge storage unit, wherein the first and second electron transfer rates differ such that the first and second charge storage molecules have different data storage persistence levels.

14. A molecular memory cell according to claim 13, wherein the second oxidation potential is greater than the first oxidation potential, and wherein the second electron-transfer rate is less than the first electron-transfer rate.

15. A molecular memory cell according to claim 14, wherein the first and second linkers are constructed from a common base unit, and wherein the second linker is longer than the first linker.

16. A molecular memory cell according to claim 14, wherein the second linker has a greater HOMO-LUMO gap than the first linker.

17. A molecular memory cell according to claim 13, wherein the first and second electrodes are coupled to first and second conductors of a conductor array.

18. A molecular memory cell according to claim 13, further comprising an access transistor coupled to one of the first and second electrodes.

19. A molecular memory cell according to claim 13, comprising a molecular transistor including the first electrode, the first charge storage molecule, the second charge storage molecule, and the second electrode, wherein the second electrode is coupled to a gate electrode of the molecular transistor and wherein the first electrode is coupled to a channel region of the molecular transistor.

20. A molecular memory cell according to claim 19, comprising an electrolyte disposed between the first and second storage molecules and the gate electrode.

21. A molecular memory cell according to claim 13, wherein the first and second charge storage molecules comprise respective first and second charge storage units independently selected from a group consisting of porphyrinic macrocycles, metallocenes, linear polyenes, cyclic polyenes, tetrathiafulvalenes, tetraselenafulvalenes, metal coordination complexes, sandwich coordination compounds, triarylamines, 1,4-phenylenediamines, xanthenes, flavins, phenazines, phenothiazines, acridines, quinolines, 2,2'-bipyridyls, 4,4'-bipyridyls, tetrathiotetracenes, and peri-bridged naphthalene dichalcogenides.

22. A molecular memory cell according to claim 13, wherein the first and second linkers are independently selected from a group consisting of 4-carboxyphenyl, 2-(4-carboxyphenyl)ethynyl, 4-(2-(4-carboxyphenyl)ethynyl) phenyl, 4-carboxymethylphenyl, 4-(2-(4-carboxymethylphenyl)ethynyl)phenyl; 4-hydroxyphenyl, 2-(4-hydroxyphenyl)ethynyl, 4-(2-(4-hydroxyphenyl) ethynyl)phenyl, 4-hydroxymethylphenyl, 4-(2-(4-hydroxymethylphenyl)ethynyl)phenyl; 4-mercaptophenyl, 2-(4-mercaptophenyl)ethynyl, 4-(2-(4-mercaptophenyl) ethynyl)phenyl, 4-mercaptomethylphenyl, 4-(2-(4-mercaptomethylphenyl)ethynyl)phenyl; 4-selenylphenyl, 2-(4-selenylphenyl)ethynyl, 4-(2-(4-selenylphenyl)ethynyl) phenyl, 4-selenylmethylphenyl, 4-(2-(4-selenylphenyl) ethynyl)phenyl; 4-tellurylphenyl, 2-(4-tellurylphenyl) ethynyl,4-(2-(4-tellurylphenyl)ethynyl)phenyl, 4-tellurylmethylphenyl, 4-(2-(4-tellurylmethylphenyl) ethynyl)phenyl; 4-vinylphenyl, 4-allylphenyl, 2-(4-vinylphenyl)ethynyl, 4-(2-(4-vinylphenyl)ethynyl)phenyl, 4-allylphenyl, 4-(2-(4-allylphenyl)ethynyl)phenyl, 4-(dihydroxyphosphoryl)phenyl, 2-[4-(dihydroxyphosphoryl)phenyl]ethynyl, 4-[2-[4-(dihydroxyphosphoryl)phenyl]ethynyl]phenyl, 4-[(dihydroxyphosphoryl)methyl]phenyl, 4-[2-(dihydroxyphosphoryl)ethyl]phenyl, 4-[2-[4-(dihydroxyphosphoryl)methylphenyl]ethynyl]phenyl; 4-(hydroxy(mercapto)phosphoryl)phenyl, 2-[4-(hydroxy (mercapto)phosphoryl)phenyl]ethynyl, 4-[2-[4-(hydroxy (mercapto)phosphoryl)phenyl]ethynyl]phenyl, 4-[(hydroxy (mercapto)phosphoryl)methyl]phenyl, 4-[2-(hydroxy (mercapto)phosphoryl)ethyl]phenyl, 4-[2-[4-(hydroxy (mercapto)phosphoryl)methylphenyl]ethynyl]phenyl; 4-cyanophenyl, 2-(4-cyanophenyl)ethynyl, 4-[2-(4-cyanophenyl)ethynyl]phenyl, 4-(cyanomethyl)phenyl, 4-(2-cyanoethyl)phenyl, 4-[2-[4-(cyanomethyl)phenyl]ethynyl] phenyl, 4-cyanobiphenyl, 4-aminophenyl, 2-(4-aminophenyl)ethynyl, 4-[2-(4-aminophenyl)ethynyl] phenyl, and 4-aminobiphenyl.

23. A molecular memory cell according to claim 13, wherein the first and second linkers are independently selected from a group consisting of methyl, ethyl, propyl, butyl, 1,4-phenylene, 1,4-phenylethyne, ethyne, 4,4'-diphenylethyne, 4,4'-diphenylbutadiyne, 4,4'-biphenyl, 4,4'-stilbene, 1,4-bicyclooctane, 4,4'-azobenzene, 4,4'-benzylideneaniline, 4,4"-terphenyl, 4,4'''-quatterphenyl, 1,4-bicyclo[2.2.2]octane, and 1,4-adamantane.

24. A molecular memory cell according to claim 13, wherein at least one of the first and second linkers comprises a structurally rigid aliphatic unit.

25. A molecular memory cell according to claim 13, wherein at least one of the first and second linkers comprises a surface attachment moiety selected from a group consisting of carboxy, hydroxy, mercapto, selenyl, telluryl, vinyl, dihydroxyphosphoryl, hydroxy(mercapto)phosphoryl, cyano, and amino groups.

26. A molecular memory cell according to claim 13:
wherein the first charge storage unit comprises a first metalloporphyrin;
wherein the first linker comprises a p-phenylene unit including a first surface attachment moiety configured to electrically couple the first linker to the first electrode and providing a first electron transfer rate;
wherein the second charge storage unit comprises a second metalloporphyrin having an oxidation potential that is shifted with respect to the first metalloporphyrin; and
wherein the second linker comprises a butyl chain, a plurality of bicyclooctane units, a p-phenylene unit, and a second surface attachment moiety configured to couple the second linker to the first electrode and providing a second electron transfer rate less than the first electron transfer rate.

27. A molecular memory cell according to claim 26, wherein the first and second metalloporphyrins comprise respective different peripheral substituent groups.

28. A molecular memory cell according to claim 27, wherein the first and second metalloporphyrins comprise respective different central metal atoms.

29. A molecular memory cell according to claim 13:
wherein the first charge storage unit comprises a first metallocene unit;
wherein the first linker comprises a first p-phenylene unit including a surface attachment moiety configured to electrically couple the first linker to the first electrode and providing a first electron transfer rate;
wherein the second charge storage unit comprises a second metallocene unit having an oxidation potential that is shifted with respect to the first metallocene unit; and
wherein the second linker comprises a second p-phenylene unit including a surface attachment moiety configured to couple the second linker to the first electrode and providing a second electron transfer rate less than the first electron transfer rate.

30. A molecular memory cell according to claim 29, wherein the first and second metallocene units bear respective different sets of electron-withdrawing and/or electron-releasing peripheral substituent groups.

31. A molecular memory cell according to claim 29, wherein the first and second linkers comprise first and second numbers of p-phenylene units, the second number grater than the first number.

32. A molecular memory cell according claim 29:
wherein the first metallocene unit comprises a first ferrocene unit; and
wherein the second metallocene unit comprises a second ferrocene unit bearing at least one acetyl group.

33. A molecular memory cell according to claim 13, wherein the first and second charge storage molecules are configured to support use of the first and second charge storage molecules as respective first and second data storage elements with substantially different volatility.

34. A molecular memory cell according to claim 33, wherein the differing first and second oxidation potentials and/or the differing first and second electron transfer rates provide discrimination for programming of the first and second data storage elements.

35. A molecular memory cell, comprising:
first and second electrodes;
a first charge storage molecule disposed between the first and second electrodes and including a first charge storage unit having a first oxidation potential and a first linker that couples the first charge storage unit to the first electrode and that provides a first electron transfer rate;
a second charge storage molecule disposed between the first and second electrodes and including a second charge storage unit having a second oxidation potential different from the first oxidation potential and a second linker that couples the second charge storage unit to the first charge storage unit and that provides a second electron transfer rate,
wherein the first and second electron transfer rates differ such that the first and second charge storage molecules have different data storage persistence levels.

36. A molecular memory cell according to claim 35, wherein the second oxidation potential is greater than the first oxidation potential, and wherein the first electron transfer rate is greater than the second electron transfer rate.

37. A molecular memory cell according to claim 36, wherein the first and second linkers are constructed from a common base unit, and wherein the second linker is longer than the first linker.

38. A molecular memory cell according to claim 36, wherein the second linker has a greater HOMO-LUMO gap than the first linker.

39. A molecular memory cell according to claim 35, comprising a molecular transistor including the first electrode, the first storage molecule, the second charge storage molecule, and the second electrode, wherein the second electrode is coupled to a gate electrode of the molecular transistor and wherein the first electrode is coupled to a channel region of the molecular transistor.

40. A molecular memory cell according to claim 39, comprising an electrolyte disposed between the second charge storage molecule and the gate electrode.

41. A molecular memory cell according to claim 35, wherein the first and second charge storage molecules comprise respective first and second charge storage units independently selected from a group consisting of porphyrinic macrocycles, metallocenes, linear polyenes, cyclic polyenes, tetrathiafulvalenes, tetraselenafulvalenes, metal coordination complexes, sandwich coordination compounds, triarylamines, 1,4-phenylenediamines, xanthenes, flavins, phenazines, phenothiazines, acridines, quinolines, 2,2'-bipyridyls, 4,4'-bipyridyls, tetrathiotetracenes, and pen-bridged naphthalene dichalcogenides.

42. A molecular memory cell according to claim 35, wherein the first and second linkers are selected from a group consisting of 4-carboxyphenyl, 2-(4-carboxyphenyl) ethynyl, 4 (2-(4-carboxyphenyl)ethynyl)phenyl, 4-carboxymethylphenyl, 4-(2-(4-carboxymethylphenyl) ethynyl)phenyl; 4-hydroxyphenyl, 2-(4-hydroxyphenyl) ethynyl, 4-(2-(4-hydroxyphenyl)ethynyl)phenyl, 4-hydroxymethylphenyl, 4-(2-(4-hydroxymethylphenyl) ethynyl)phenyl; 4-mercaptophenyl, 2-(4-mercaptophenyl) ethynyl, 4-(2-(4-mercaptophenyl)ethynyl)phenyl, 4-mercaptomethylphenyl, 4-(2-(4-mercaptomethylphenyl) ethynyl)phenyl; 4-selenylphenyl, 2-(4-selenylphenyl) ethynyl, 4-(2-(4-selenylphenyl)ethynyl)phenyl, 4-selenylmethylphenyl, 4-(2-(4-selenylphenyl)ethynyl) phenyl; 4-tellurylphenyl, 2-(4-tellurylphenyl)ethynyl,4-(2-(4-tellurylphenyl)ethynyl)phenyl, 4-tellurylmethylphenyl, 4-(2-(4-tellurylmethylphenyl)ethynyl)phenyl; 4-vinylphenyl, 4-allylphenyl, 2-(4-vinylphenyl)ethynyl, 4-(2-(4-vinylphenyl)ethynyl)phenyl, 4-allylphenyl, 4-(2-(4-allylphenyl)ethynyl)phenyl, 4-(dihydroxyphosphoryl) phenyl, 2-[4-(dihydroxyphosphoryl)phenyl]ethynyl, 4-[2-[4-(dihydroxyphosphoryl)phenyl]ethynyl]phenyl, 4-[(dihydroxyphosphoryl)methyl]phenyl, 4-[2-(dihydroxyphosphoryl)ethyl]phenyl, 4-[2-[4-(dihydroxyphosphoryl)methylphenyl]ethynyl]phenyl; 4-(hydroxy(mercapto)phosphoryl)phenyl, 2-[4-(hydroxy (mercapto)phosphoryl)phenyl]ethynyl, 4-[2-[4-(hydroxy (mercapto)phosphoryl)phenyl]ethynyl]phenyl, 4-[(hydroxy (mercapto)phosphoryl)methyl]phenyl, 4-[2-(hydroxy (mercapto)phosphoryl)ethyl]phenyl, 4-[2-[4-(hydroxy (mercapto)phosphoryl)methylphenyl]ethynyl]phenyl 4-cyanophenyl, 2-(4-cyanophenyl)ethynyl, 4-[2-(4-cyanophenyl)ethynyl]phenyl, 4-(cyanomethyl)phenyl, 4-(2-cyanoethyl)phenyl, 4-[2-[4-(cyanomethyl)phenyl]ethynyl] phenyl, 4-cyanobiphenyl, 4-aminophenyl, 2-(4-aminophenyl)ethynyl, 4-[2-(4-aminophenyl)ethynyl] phenyl, and 4-aminobiphenyl.

43. A molecular memory cell according to claim 35, wherein the first and second linkers are independently selected from a group consisting of methyl, ethyl, propyl, butyl, 1,4-phenylene, 1,4-phenylethyne, ethyne, 4,4'-diphenylethyne, 4,4'-diphenylbutadiyne, 4,4'-biphenyl, 4,4'-stilbene, 1,4-bicyclooctane, 4,4'-azobenzene, 4,4'-benzylideneaniline, 4,4"-terphenyl, 4,4'''-quatterphenyl, 1,4-bicyclo[2.2.2]octane, and 1,4-adamantane.

44. A molecular memory cell according to claim 35, wherein at least one of the first and second linkers comprises a structurally rigid aliphatic molecule.

45. A molecular memory cell according to claim 35, wherein at least one of the first and second linkers comprises a surface attachment moiety selected from a group consisting of carboxy, hydroxy, mercapto, selenyl, telluryl, vinyl, dihydroxyphosphoryl, hydroxy(mercapto)phosphoryl, cyano, and amino groups.

46. A molecular memory cell according to claim 35:
wherein the first charge storage unit comprises a first metalloporphyrin;
wherein the first linker comprises a p-phenylene unit including a surface attachment moiety configured to electrically couple the first linker to the first electrode;

wherein the second charge storage unit comprises a second metalloporphyrin having an oxidation potential that is shifted with respect to the first metalloporphyrin; and wherein the second linker comprises a butyl chain, a plurality of bicyclooctane units, and a p-phenylene unit configured to couple the second linker to the first charge storage unit.

47. A molecular memory cell according to claim 46, wherein the first and second metalloporphyrins comprise respective different peripheral substituent groups.

48. A molecular memory cell according to claim 46, wherein the first and second metalloporphyrins comprise respective different central metal atoms.

49. A molecular memory cell according to claim 35, wherein the first and second electrodes are coupled to first and second conductors of a conductor array.

50. A molecular memory cell according to claim 35, further comprising an access transistor coupled to one of the first and second electrodes.

51. A molecular memory cell according to claim 35, wherein the first and second charge storage molecules are configured to support use of the first and second charge storage molecules as respective first and second data storage elements with substantially different volatility.

52. A molecular memory cell according to claim 51, wherein the differing first and second oxidation potentials of the respective first and second charge storage molecules and/or the differing first and second electron transfer rates provide discrimination for programming of the first and second data storage elements.

53. A molecular transistor, comprising:

a substrate;

spaced-apart first and second source/drain regions in the substrate;

a gate electrode disposed between the first and second source/drain regions; and first and second charge storage molecules disposed between the gate electrode and a portion of the substrate between the first and second source/drain regions and coupled to the substrate by a molecular linkage that provides respective first and second electron transfer rates for the first and second charge storage molecules that differ such that the first and second charge storage molecules have different data storage persistence levels.

54. A molecular transistor according to claim 53, wherein the molecular linkage comprises:

a first charge storage unit;

a first linker that couples the first charge storage unit to the substrate;

a second charge storage unit; and a second linker that couples the second charge storage unit to the substrate.

55. A molecular transistor according to claim 54, comprising an electrolyte disposed between the first and second charge storage molecules and the gate electrode.

56. A molecular transistor according to claim 54, wherein the molecular linkage comprises:

a first charge storage unit;

a first linker that couples the first charge storage unit to the substrate;

a second charge storage unit; and a second linker that couples the second charge storage unit to the first charge storage unit.

57. A molecular transistor according to claim 56, comprising an electrolyte disposed between the second charge storage molecule and the gate electrode.

58. A molecular transistor according to claim 54, wherein the second charge storage molecule has a higher oxidation potential than the first charge storage molecule, and wherein the molecular linkage provides a greater electron transfer rate for the first charge storage molecule than for the second charge storage molecule.

59. A molecular memory cell according to claim 1, wherein the first and second charge storage molecules have respective different first and second oxidation potentials.

60. A molecular memory cell according to claim 1, wherein the first and second charge storage molecules and the molecular linkage are configured to support use of the first and second charge storage molecules as first and second data storage elements with substantially different volatility.

61. A molecular memory cell according to claim 60, wherein differing first and second oxidation potentials of the respective first and second charge storage molecules and/or the differing first and second electron transfer rates provide discrimination for programming of the first and second data storage elements.

62. A molecular transistor according to claim 53, wherein the first and second charge storage molecules have respective different first and second oxidation potentials.

63. A molecular transistor according to claim 53, wherein the first and second charge storage molecules and the molecular linkage are configured to support use of the first and second charge storage molecules as first and second data storage elements with substantially different volatility.

64. A molecular transistor according to claim 63, wherein the differing first and second oxidation potentials of the respective first and second charge storage molecules and/or the differing first and second electron transfer rates provide discrimination for programming of the first and second data storage elements.

* * * * *

UNITED STATES PATENT AND TRADEMARK OFFICE
CERTIFICATE OF CORRECTION

PATENT NO. : 6,944,047 B2
DATED : September 13, 2005
INVENTOR(S) : Eric Rotenberg et al.

It is certified that error appears in the above-identified patent and that said Letters Patent is hereby corrected as shown below:

Column 14,
Line 4, change "(mercapto)phosphoryl)methyllphenyl" to
-- (mercapto)phosphoryl)methyl]phenyl --.

Column 18,
Line 8, change "and pen-" to -- and peri- --.

Signed and Sealed this

Eighth Day of November, 2005

JON W. DUDAS
*Director of the United States Patent and Trademark Office*